(12) United States Patent
Wang et al.

(10) Patent No.: US 8,212,233 B2
(45) Date of Patent: Jul. 3, 2012

(54) FORMING PHASE-CHANGE MEMORY USING SELF-ALIGNED CONTACT/VIA SCHEME

(75) Inventors: Ming-Tsong Wang, Taipei (TW); Chien-Chih Chiu, Xinying (TW); Tsun Kai Tsao, Yongkang (TW); Chi-Hsin Lo, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 213 days.

(21) Appl. No.: 12/713,541

(22) Filed: Feb. 26, 2010

(65) Prior Publication Data
US 2010/0301303 A1 Dec. 2, 2010

Related U.S. Application Data

(60) Provisional application No. 61/182,020, filed on May 28, 2009.

(51) Int. Cl.
*H01L 45/00* (2006.01)
*H01L 21/8239* (2006.01)
*H01L 27/105* (2006.01)

(52) U.S. Cl. ........ . 257/4; 257/72; 257/E45.002; 257/E27.081; 438/238

(58) Field of Classification Search ....... 257/4, E45.002, 257/E27.081, 72; 438/238
See application file for complete search history.

(56) References Cited

U.S. PATENT DOCUMENTS

| | | | | |
|---|---|---|---|---|
| 2006/0205145 | A1* | 9/2006 | Moore et al. | 438/244 |
| 2011/0300683 | A1* | 12/2011 | Park et al. | 438/381 |

OTHER PUBLICATIONS

Breitwisch, M. J., "Phase Change Memory," International Interconnect Technology Conference, IEEE, 2008, pp. 219-221.
Castro, D. T., et al., "Evidence of the Thermo-Electric Thomson Effect and Influence on the Program Conditions and Cell Optimization in Phase-Change Memory Cells," International Electron Devices Meeting, IEEE, 2007, pp. 315-318.
Cho, W. Y., et al., "A 0.18- μm 3.0-V 64-Mb Nonvolatile Phase-Transition Random Access Memory (PRAM)," IEEE Journal of Solid-State Circuits, vol. 40, No. 1, Jan. 2005, pp. 293-300.
Lankhorst, M. H. R., et al., "Low-Cost and Nanoscale Non-Volatile Memory Concept for Future Silicon Chips," Nature Materials, vol. 4, Apr. 2005, pp. 347-352.
Lowrey, T. A., et al., "Characteristics of OUM Phase Change Materials and Devices for High Density Nonvolatile Commodity and Embedded Memory Applications," Mat. Res. Soc. Symp. Proc., vol. 803, 2004, pp. HH2.1.1-HH2.1.12.
Wuttig, M., "Towards a Universal Memory?" Nature Materials, vol. 4, Apr. 2005, pp. 265-266.

* cited by examiner

*Primary Examiner* — Cuong Q Nguyen
*Assistant Examiner* — Cathy N Lam
(74) *Attorney, Agent, or Firm* — Slater & Matsil, L.L.P.

(57) ABSTRACT

An integrated circuit structure includes a dielectric layer having an upper portion and a lower portion. The dielectric layer is either an inter-layer dielectric (ILD) or an inter-metal dielectric (IMD). A phase change random access memory (PCRAM) cell includes a phase change strip, wherein the phase change strip is on the lower portion and has a top surface lower than a top surface of the dielectric layer, and a bottom surface higher than a bottom surface of the dielectric layer. A first conductive column is electrically connected to the phase change strip. The first conductive column extends from the top surface of the dielectric layer down into the dielectric layer. A second conductive column is in a peripheral region. The second conductive column extends from the top surface of the dielectric layer down into the dielectric layer. The first conductive column and the second conductive column have different heights.

19 Claims, 12 Drawing Sheets

FIG. 14

FORMING PHASE-CHANGE MEMORY USING SELF-ALIGNED CONTACT/VIA SCHEME

This application claims the benefit of U.S. Provisional Application No. 61/182,020 filed on May 28, 2009, entitled "Forming Phase-Change Memory Using Self-Aligned Contact/Via Scheme," which application is hereby incorporated herein by reference.

TECHNICAL FIELD

This invention relates generally to semiconductor devices and fabrication processes, and more particularly to phase change random access memory (PCRAM) devices and methods of forming the same.

BACKGROUND

Phase change technology is promising for next generation memories. It uses chalcogenide semiconductors for storing states. The chalcogenide semiconductors, also called phase change materials, have a crystalline state and an amorphous state. In the crystalline state, the phase change materials have a low resistivity, while in the amorphous state they have a high resistivity. The resistivity ratios of the phase change materials in the amorphous and crystalline states are typically greater than 1000 and thus the phase change memory devices are unlikely to have erroneous reading. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase change random access memory (PCRAM).

PCRAM has several operating and engineering advantages, including high speed, low power, non-volatility, high density, and low cost. For example, PCRAM devices are non-volatile and may be written into rapidly, for example, within less than about 50 nanoseconds. The PCRAM cells may have a high density. In addition, PCRAM memory cells are compatible with CMOS logic and can generally be produced at a low cost compared to other types of memory cells.

Figure 1:
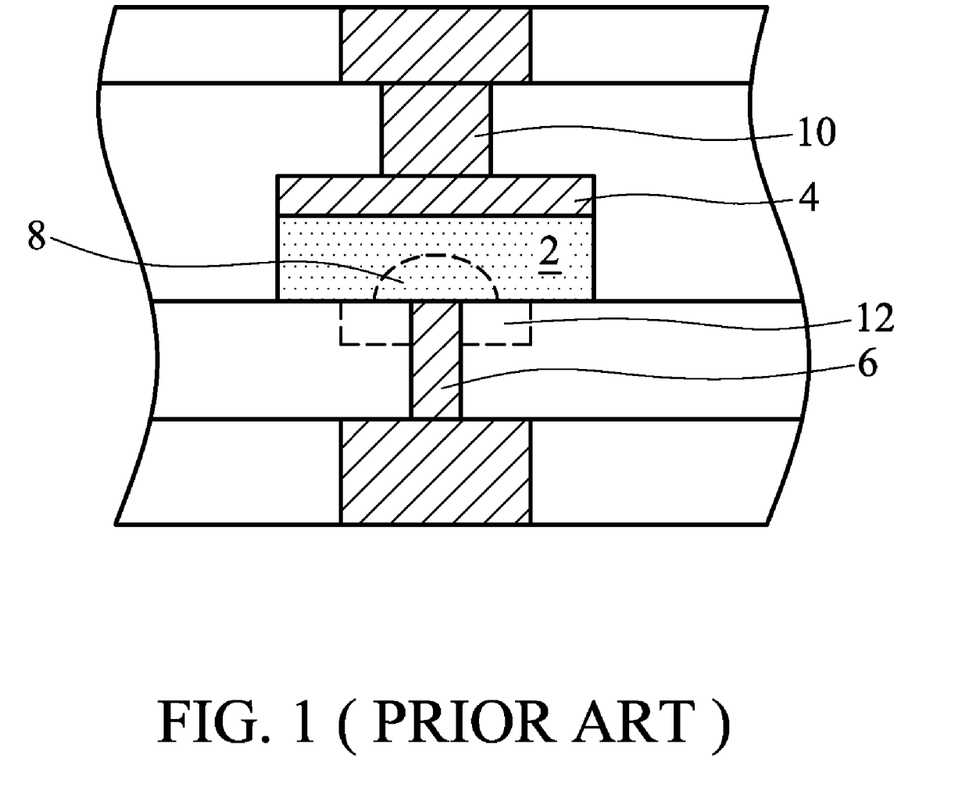
FIG. 1 illustrates a conventional phase change random access memory (PCRAM) cell.

FIG. 1 illustrates a conventional bottom-contact PCRAM cell. Phase change material 2 is formed between top electrode 4 and bottom electrode contact 6. In a reset operation, phase change material 2 may be heated up to a temperature higher than the melting temperature when a current passes through it. The temperature is then quickly dropped below the crystallization temperature. A portion of the phase change material, as schematically shown in region 8, is changed to an amorphous state with a high resistivity, thus the state of the PCRAM cell is changed to a high-resistance state. Region 8 can be set back to the crystalline state by heating up the phase change material 2 to a temperature higher than the crystallization temperature, but below the melting temperature, for a certain period.

The PCRAM memory cell as shown in FIG. 1 suffers from drawbacks when integrated with the manufacturing processes of logic devices. The PCRAM memory cell requires three or more photo masks in addition to existing logic circuit manufacturing processes. For example, each of phase change material 2 and top electrode 4 requires one photo mask. Bottom electrode 6 and top electrode contact 10 in combination at least need one additional photo mask. In addition, heater 12 may be needed to generate heat for the phase transition, and hence the number of additional photo masks is increased to four. Accordingly, there is the need for reducing the manufacturing cost of the PCRAM by reducing the number of photo masks.

SUMMARY OF THE INVENTION

In accordance with one aspect of the present invention, an integrated circuit structure includes a dielectric layer having an upper portion and a lower portion. The dielectric layer is either an inter-layer dielectric (ILD) or an inter-metal dielectric (IMD). A phase change random access memory (PCRAM) cell includes a phase change strip, wherein the phase change strip is on the lower portion and has a top surface lower than a top surface of the dielectric layer, and a bottom surface higher than a bottom surface of the dielectric layer. A first conductive column is electrically connected to the phase change strip. The first conductive column extends from the top surface of the dielectric layer down into the dielectric layer. A second conductive column is in a peripheral region. The second conductive column extends from the top surface of the dielectric layer down into the dielectric layer. The first conductive column and the second conductive column have different heights.

Other embodiments are also disclosed.

The advantageous features of the present invention include reduced number of photo masks, and hence reduced manufacturing cost. Further, the manufacturing process of the PCRAM is fully compatible with the existing logic circuit manufacturing process.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel phase change random access memory (PCRAM) and the method of forming the same are provided. The intermediate stages of manufacturing embodiments of the present invention are illustrated. The variations and the operation of the embodiments are also discussed. Throughout the various views and illustrative embodiments of the present invention, like reference numbers are used to designate like elements.

Figure 2:
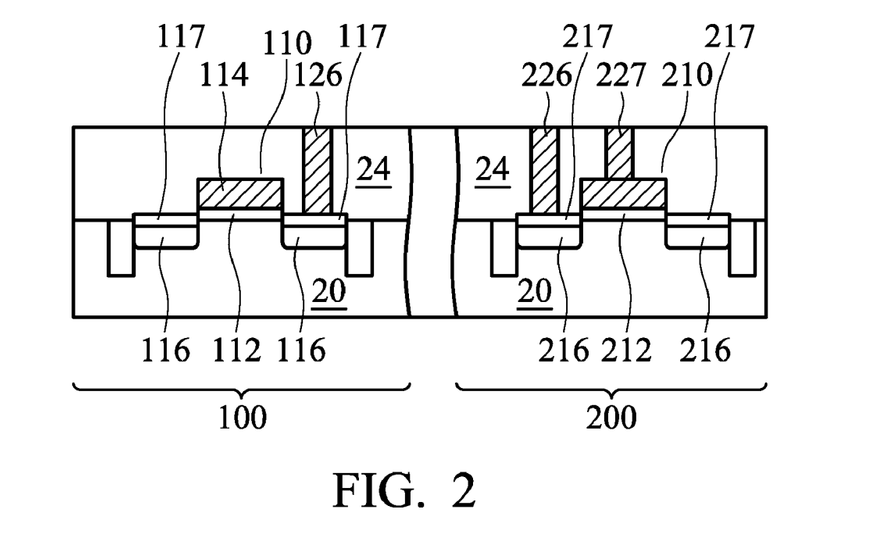
FIGS. 2 through 7 are cross-sectional views and top views of intermediate stages in the manufacturing of a PCRAM cell in accordance with an embodiment.

FIGS. 2 through 6 illustrate cross-sectional view of the manufacturing process of a PCRAM cell in accordance with an embodiment. Referring to FIG. 2, substrate 20 may be a semiconductor substrate formed of commonly used semiconductor materials such as silicon, silicon germanium, gallium arsenide, and the like, and may be a bulk substrate or a semiconductor-on-insulator substrate. Substrate 20 includes PCRAM region 100, in which PCRAM cells are to be formed, and peripheral region 200, which may be a logic circuit region including, but not limited to, the control circuit of the PCRAM cells.

In PCRAM region 100, access transistor 110 is formed. Access transistor 110 includes gate dielectric 112, gate electrode 114, source and drain regions (referred to source/drain regions hereinafter) 116, and source/drain silicides 117. Similarly, in peripheral region 200, transistor 210 is formed, and transistor 210 includes gate dielectric 212, gate electrode 214, source/drain regions 216, and source/drain silicides 217. For simplicity, components that are commonly formed in integrated circuits, such as gate silicides, contact etch stop layer, and the like, are not illustrated.

Lower inter-layer dielectric (ILD) 24 is formed over transistors 110 and 210. Contact plugs 126 and 226 are formed in ILD 24 for accessing source/drain regions 116 and 216 of transistors 110 and 210, respectively. Throughout the description, contact plugs are also referred to as conductive columns. The formation processes of contact plugs 126 and 226 may include forming openings in ILD 24, filling the openings, and then performing a chemical mechanical polish (CMP). Gate contact plug 227 electrically connects gate electrode 214 to overlying metal lines and vias (not shown). Again, for simplicity, the gate contact plug for accessing gate electrode 114 is not shown, although it is also formed simultaneously with contact plugs 126 and 226. Contact plugs 126 and 226 may be formed of tungsten (W), although other conductive materials such as silver, aluminum (Al), copper (Cu), AlCu, and the like may also be used or added.

Figure 3:
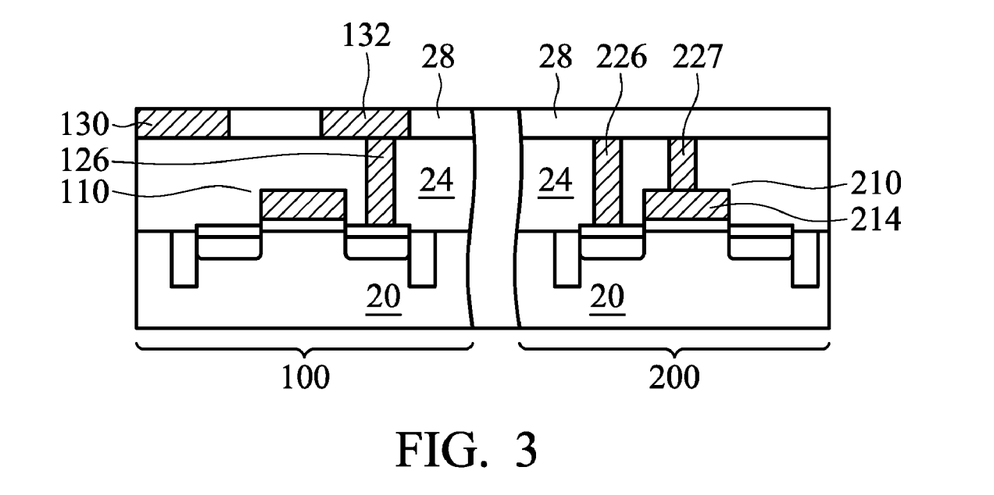

Referring to FIG. 3, middle ILD 28 and bottom electrodes 130 and 132 are formed. Bottom electrodes 130 and 132 are electrically separated from each other with a gap therebetween. In an embodiment, bottom electrodes 130 and 132 are formed of Al, Cu, AlCu, W, or other metallic materials. The formation methods may include commonly used single damascene process, during which middle ILD 28 is formed, followed by forming openings, and filling metallic materials into the openings. A CMP is then performed to remove excess metallic materials, leaving bottom electrodes 130 and 132. In alternative embodiments, a blanket metallic material is formed on ILD 24, and is then patterned, leaving bottom electrodes 130 and 132. Middle ILD 28 is then filled.

Figure 4A:
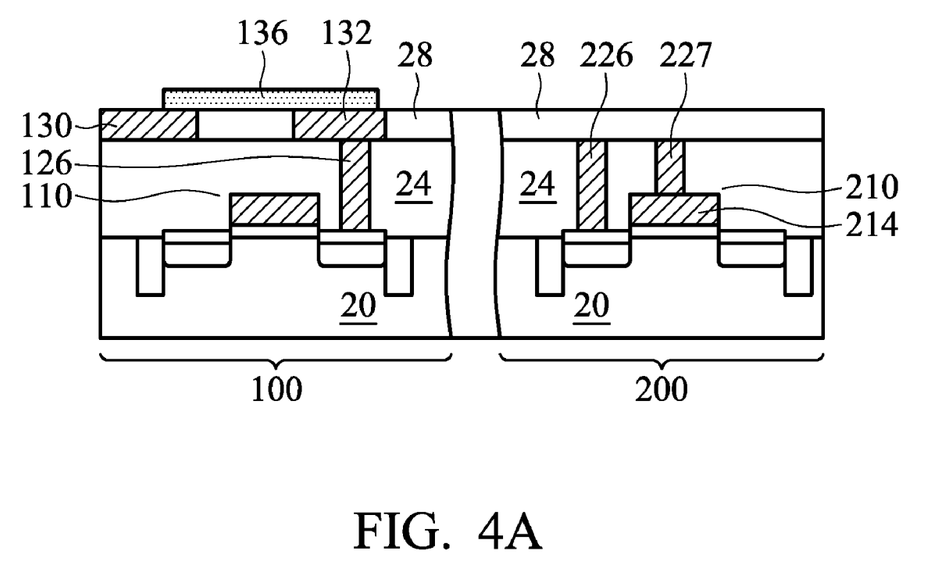
Figure 4B:
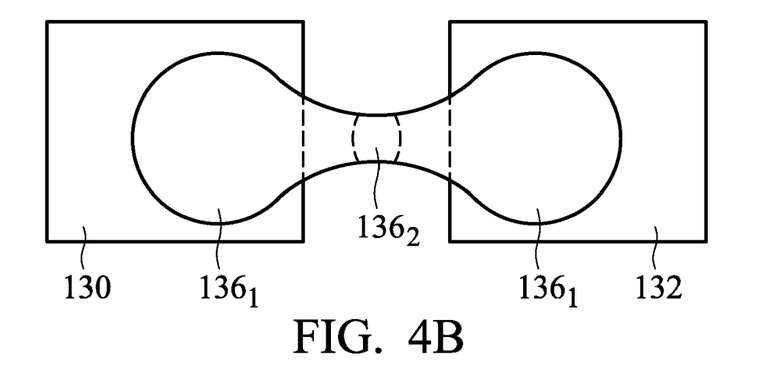
Figure 4C:
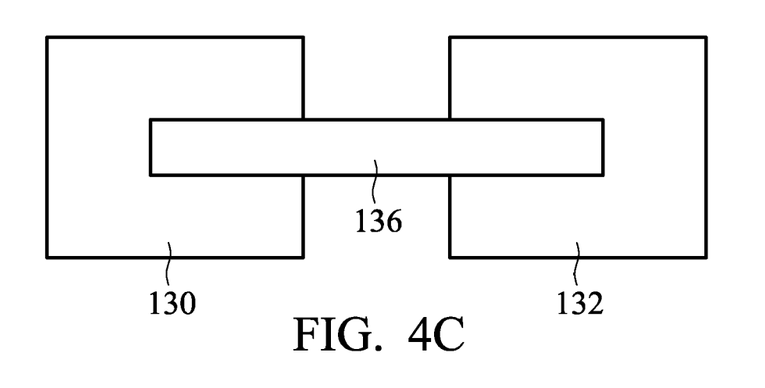
Figure 4D:
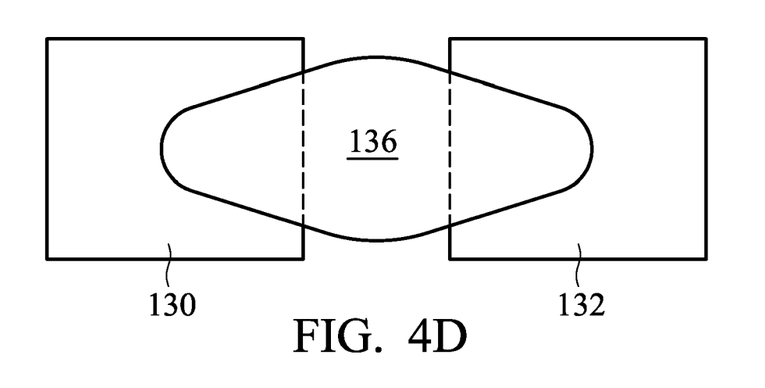

FIG. 4A illustrates the formation of phase change strip 136, which is electrically connected between, and may contact, bottom electrodes 130 and 132. Phase change strip 136 may comprise commonly used chalcogenide materials including, but not limited to, one or more of Ge, Te, and Sb, e.g., which may be GeSbTe or stoichiometric materials. FIGS. 4B, 4C, and 4D are top views of phase change strip 136 and bottom electrodes 130 and 132. In FIG. 4B, phase change strip 136 has a dog-bone shape with wider portions $136_1$ and narrow portion $136_2$ between wider portions $136_1$. Wider portions $136_1$ contact bottom electrodes 130 and 132. Due to the relatively great resistance of narrow portion $136_2$, the phase change may occur at narrow portion $136_2$. Referring to FIG. 4C, phase change strip 136 has a substantially uniform width, and hence the phase change may occur at any portion. In FIG. 4D, the end portions of phase change strip 136 are narrower than the middle portion, and hence are more likely to have the phase change.

Figure 5:
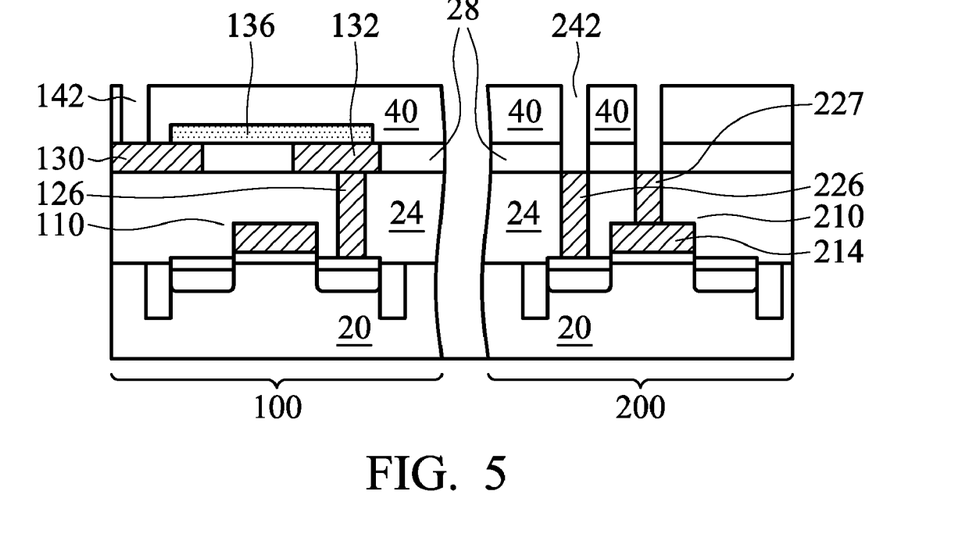
Figure 6:
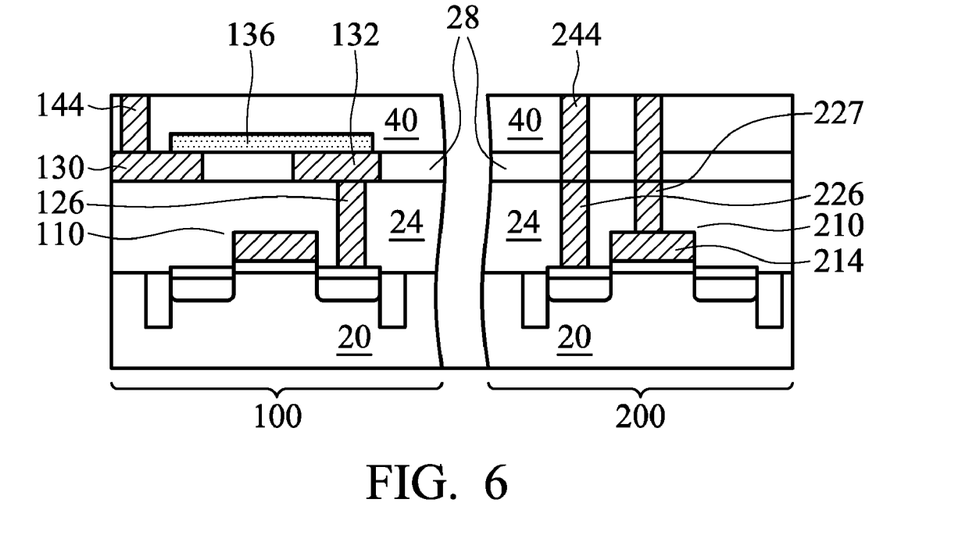

FIG. 5 illustrates the formation of upper ILD 40. Lower ILD 24, middle ILD 28, and upper ID 40 in combination form an integrated ILD. First, upper ILD 40 is formed to cover phase change strip 136 and middle ILD 28. Openings 142 and 242 are then formed in upper ILD 40. The formation of openings 142 and 242 are self-aligned, that is, the etching is stopped on bottom electrode 130 and contact plug 226, although openings 142 and 242 have different depths. Bottom electrode 130 and contact plug 226 thus act as etch stop layers during the etching. Next, as is shown in FIG. 6, openings 142 and 242 are filled with conductive materials, such as W, Al, Cu, AlCu, or combinations thereof, forming contact plugs 144 and 244, respectively. It is noted that although contact plugs 226 and 244 in combination act as one contact plug, due to process reasons, each of the contact plugs 226 and 244 may have a tapered profile, with upper portions wider than the respective lower portions. Accordingly, contact plugs 226 and 244 can still be distinguished from each other.

Figure 7:
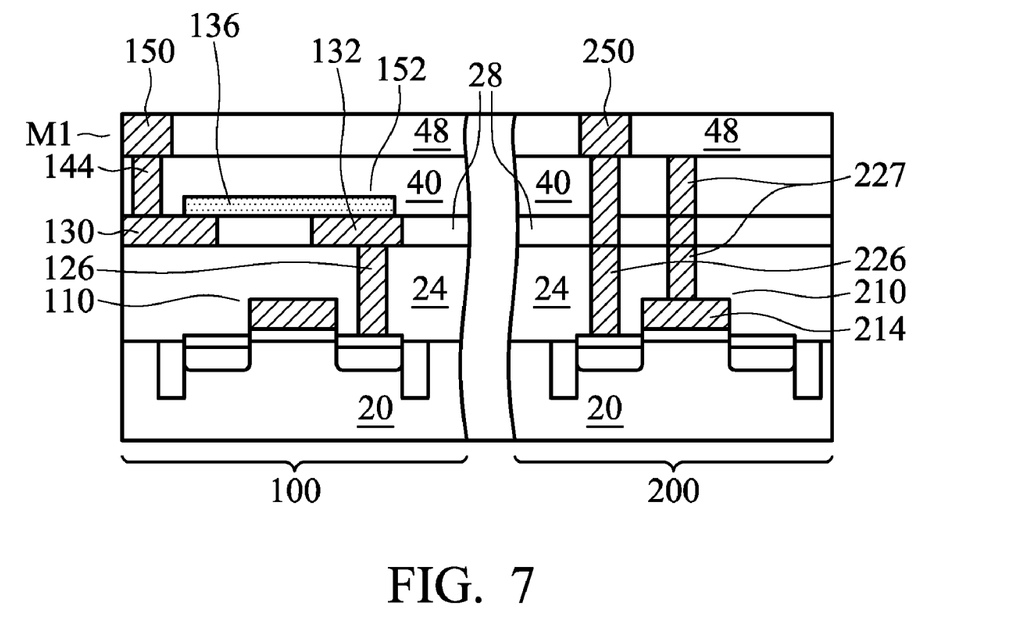

FIG. 7 illustrates the formation of the bottom metallization layer, which is commonly known as M1. In an embodiment, metallization layer M1 includes dielectric layer 48, and metal lines 150 and 250 in dielectric layer 48. Metal lines 150 and 250 may be formed using well-known single damascene process, and may be formed of copper or copper alloys such as AlCu, although other metallic material may also be used.

In the resulting PCRAM, access transistor 110 controls the access to PCRAM cell 152, and hence itself may be a part of, PCRAM cell 152, which includes phase change strip 136. During the set operations, reset operations, and read operations of PCRAM cell 152, access transistor 110 is turned on to allow currents to flow through phase change strip 136. Since phase change strip 136 has a higher resistance than bottom electrodes 130 and 132 and contact plugs 126 and 144, adequate heat may be generated in phase change strip 136, so that the phase of phase change strip 136 is changed, possibly at where it is narrow (FIGS. 4B, 4C, and 4D). The structure as shown in FIG. 7 needs three additional masks over the manufacturing process of logic circuits such as the circuit in region 200. For example, bottom electrodes 130 and 132 need one photo mask, phase change strip 136 needs one photo mask, and contact plugs 144 and 244 need one photo mask.

Figure 8A:
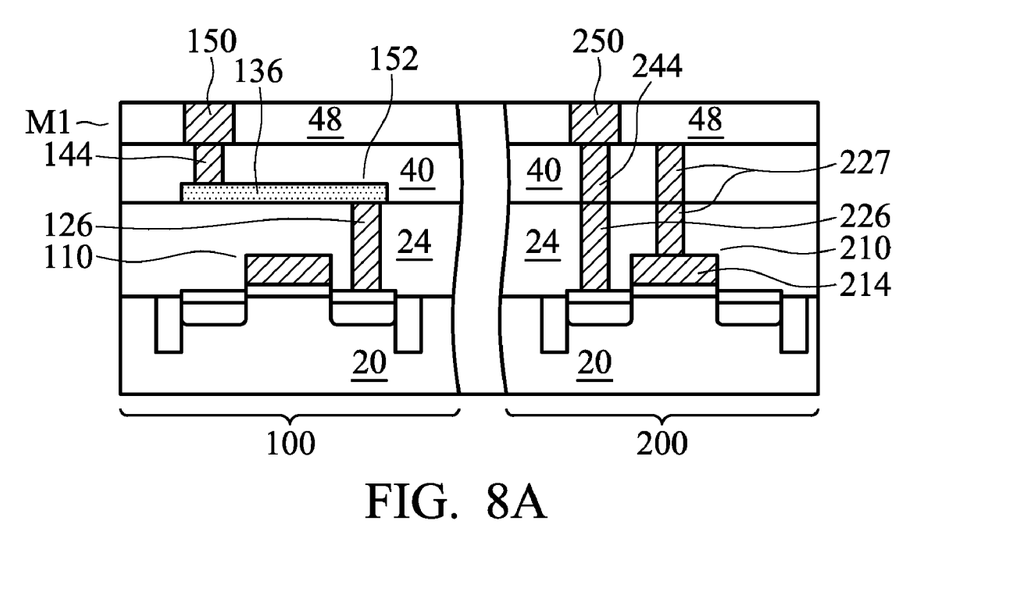
FIGS. 8 through 12 illustrate alternative embodiments of the present invention.
Figure 8B:
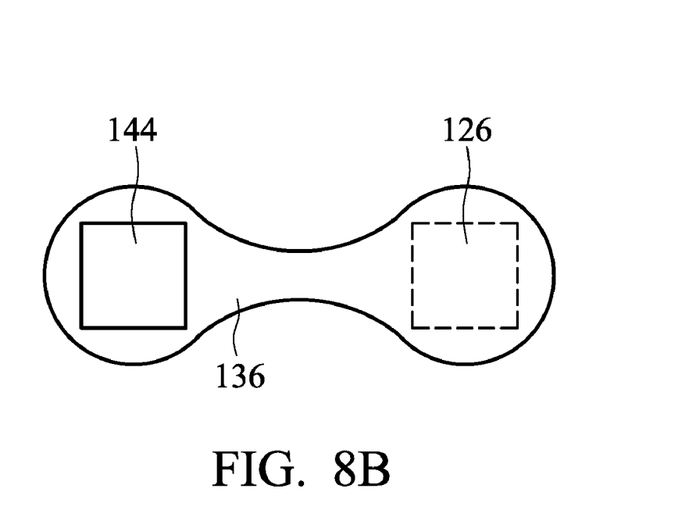

FIG. 8A illustrates an alternative embodiment. The structure as shown in FIG. 8 is similar to the structure as shown in FIG. 7, except bottom electrodes 130 and 132 are omitted. Accordingly, contact plugs 126 and 144, instead of contacting bottom electrodes 130 and 132, now contact phase change strip 136 directly. Phase change strip 136 and contact plug 226 act as etch stop layers in the formation of contact plugs 144 and 244, respectively. Accordingly, the formation process of the structure as shown in FIG. 8 is also self-aligned. Please note that an entirety of contact plug 144 needs to land on phase change strip 136, as shown in the top view of FIG. 8B. Otherwise, the etching of upper ILD 40 cannot be stopped fully. In this embodiment, only two masks are needed, including the mask for forming phase change strip 136 and the mask for forming contact plugs 144 and 244. However, care needs to be taken so that phase change strip 136 is not damaged during the etching.

Figure 9:
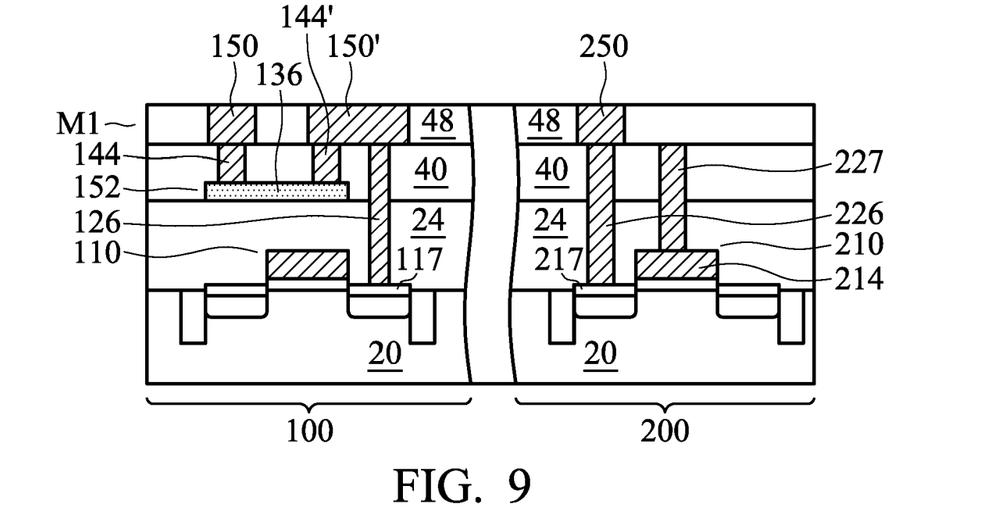

FIG. 9 illustrates yet another embodiment, wherein only one additional mask is needed. In this embodiment, contact plugs 144, 144', 126, and 226 are formed simultaneously after the formation of phase change strip 136 and the formation of upper ILD 40. In the formation of the openings in which contact plugs 126, 226, 144, and 144' are filled, silicides 117, 217 and phase change strip 136 are used as etch stop layers, and hence the formation process is also self-aligned. The addition mask is for forming phase change strip 136, while all other components may be formed simultaneously with the formation of exist peripheral circuit manufacturing process.

Figure 10:
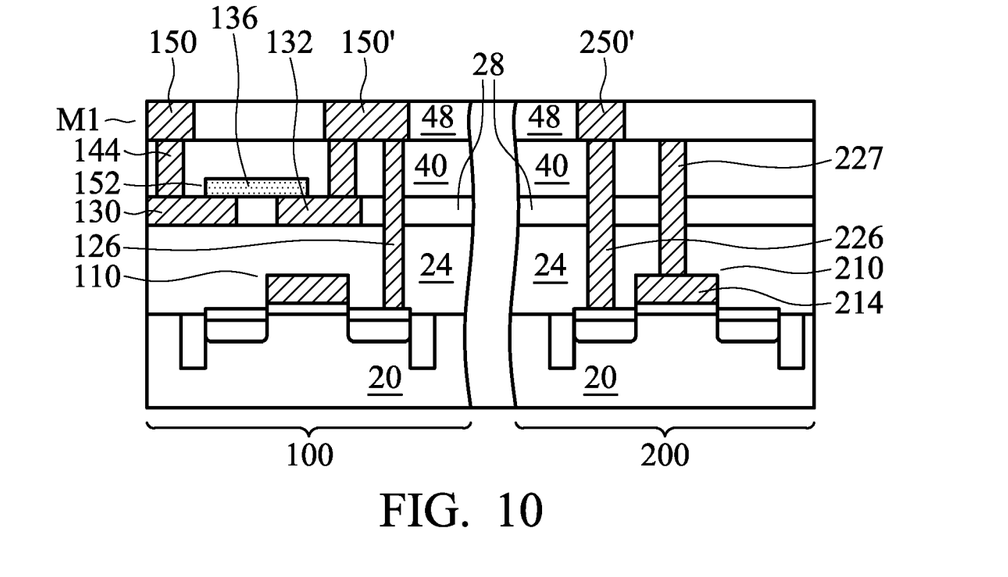

FIG. 10 illustrates yet other embodiment, in which bottom electrodes 130 and 132 are formed. The electrical connection to bottom electrodes 130 and 132 are both made from over bottom electrodes 130 and 132 through contact plugs 144 and 144'. In this embodiment, only two additional masks are needed, one for forming phase change strip 136, and one for forming bottom electrodes 130 and 132.

Figure 11:
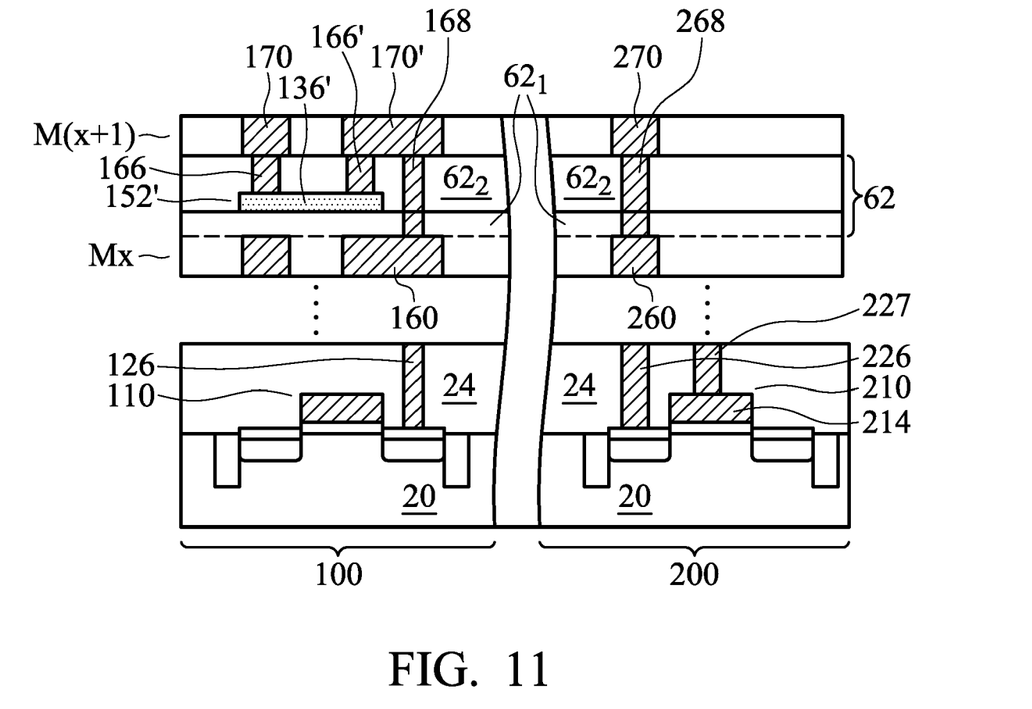

FIG. 11 illustrates an alternative embodiment, wherein the PCRAM cell is formed in an inter-metal dielectric (IMD) layer between two neighboring metallization layers, which are referred to as Mx and M(x+1), wherein x is an integer equal to or greater than 1. Metal line 160 may be electrically connected to contact plug 126, so that access transistor 110 can control the access to the PCRAM cell 152. IMD 62 is divided into lower portion $62_1$ and upper portion $62_2$. Again, phase change strip 136' is formed on lower portion $62_1$. Vias 166, 166', 168 and 268 are formed after the formation of IMD upper portion $62_2$. Throughout the description, vias are also referred to conductive columns. Metal lines 170, 170', and 270 are formed in metallization layer M(x+1), and may be formed simultaneous with the underlying vias 166, 166', 168 and 268 using a dual damascene process. The details of the dual damascene process are known in the art, and hence are not repeated herein. Metal lines 170, 170', and 270 and the underlying vias 166, 166', 168 and 268 may be formed of copper, copper alloys, Al, AlCu, and other applicable metallic materials. It is noted that vias 166 and 166' have different heights than vias 168 and 268, and hence their formation are self-aligned with phase change strip 136' and metal line 260 acting as etch stop layers. Vias 166 and 166' may physically contact phase change strip 136'.

Figure 12:
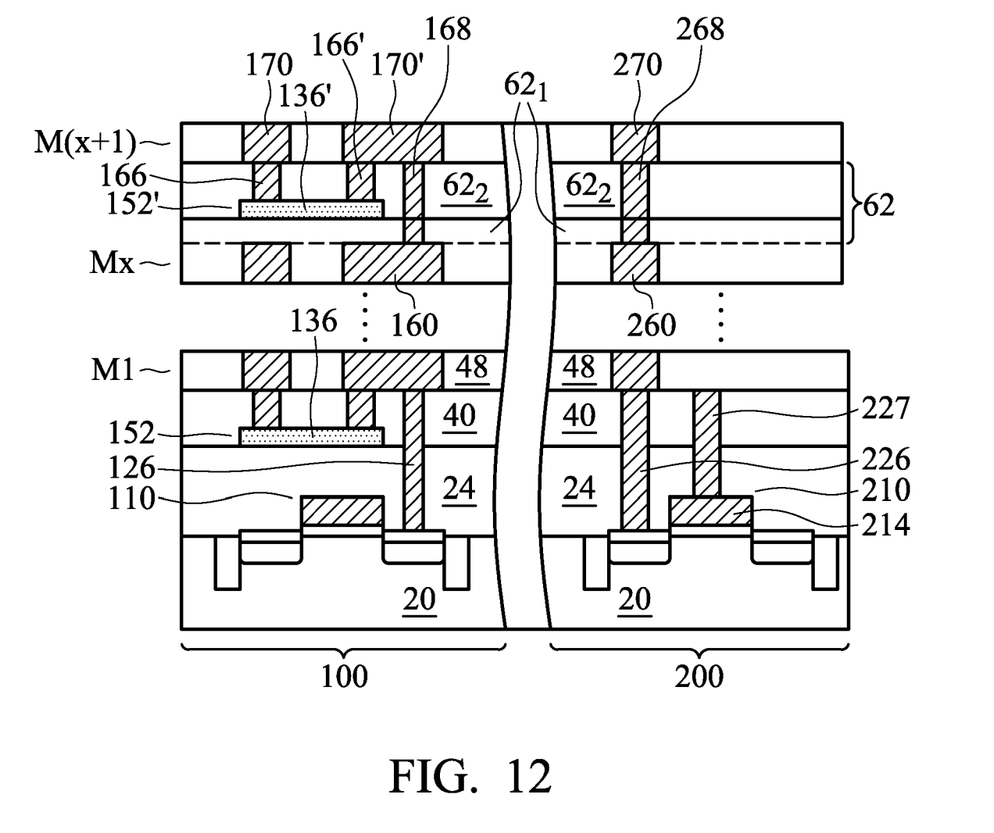

FIG. 12 illustrates yet another embodiment, in which PCRAM cells are formed in both the ILD including layers 24 and 40 and IMDs (including IMD 62). Access transistor 110 controls the access to PCRAM cell 152, while PCRAM cell 152' is controlled by another transistor (not shown).

Figure 13:
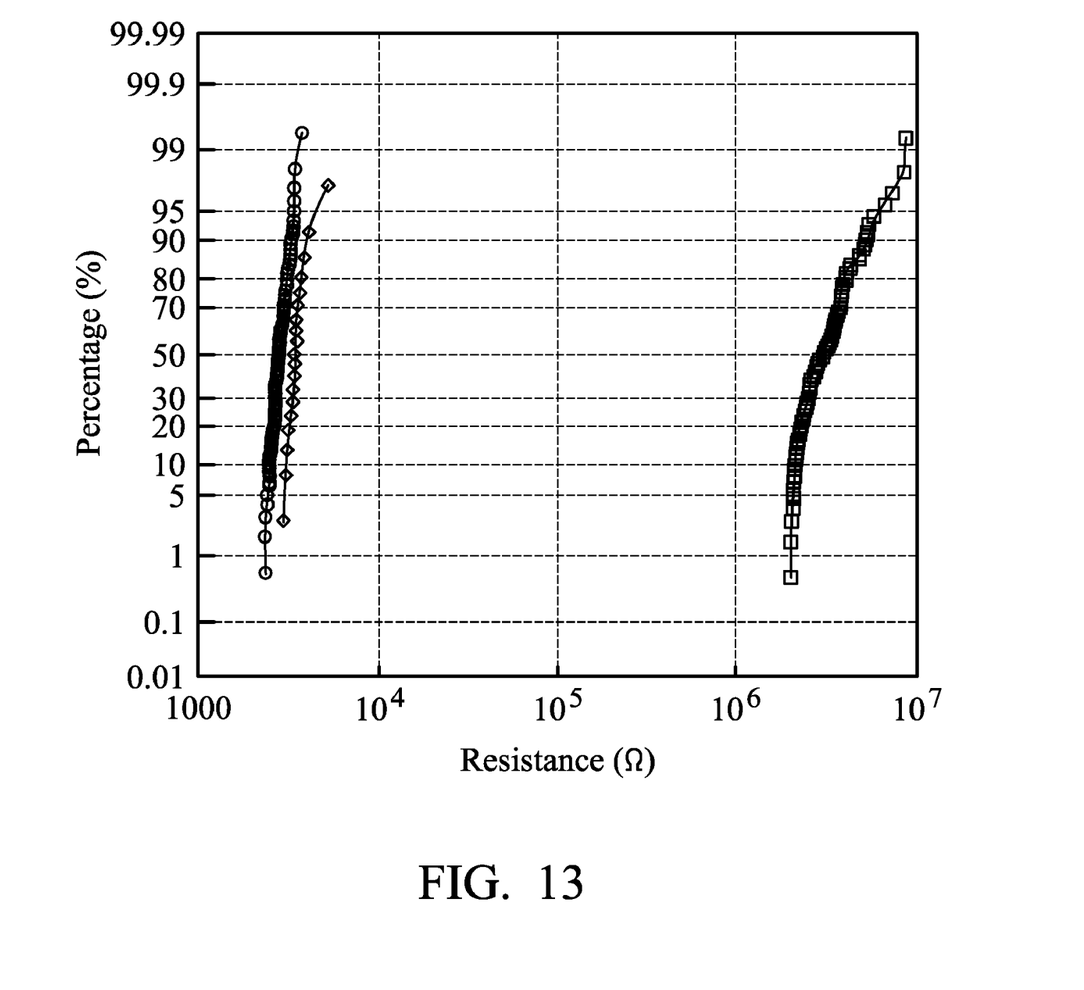
FIG. 13 illustrates the distribution of resistances of PCRAM cells.

FIG. 13 illustrates experiment results showing the distribution of PCRAM cells in set and reset operations, wherein samples having the structure as shown in FIG. 7 were tested. The X-axis indicates the resistances of the samples, while the Y-axis indicates the accumulated percentage. It is noted that the resistances of the PCRAM cells after set (points 82) and reset operations (points 84) have about three-order difference. Also, the initial resistances (before any set and reset operations are performed, points 80) of the samples and the resistances (points 82) of the samples after set operations are performed are close to each other. The results shown in FIG. 13 reveal that the embodiments can be reliably operated as PCRAM.

Figure 14:
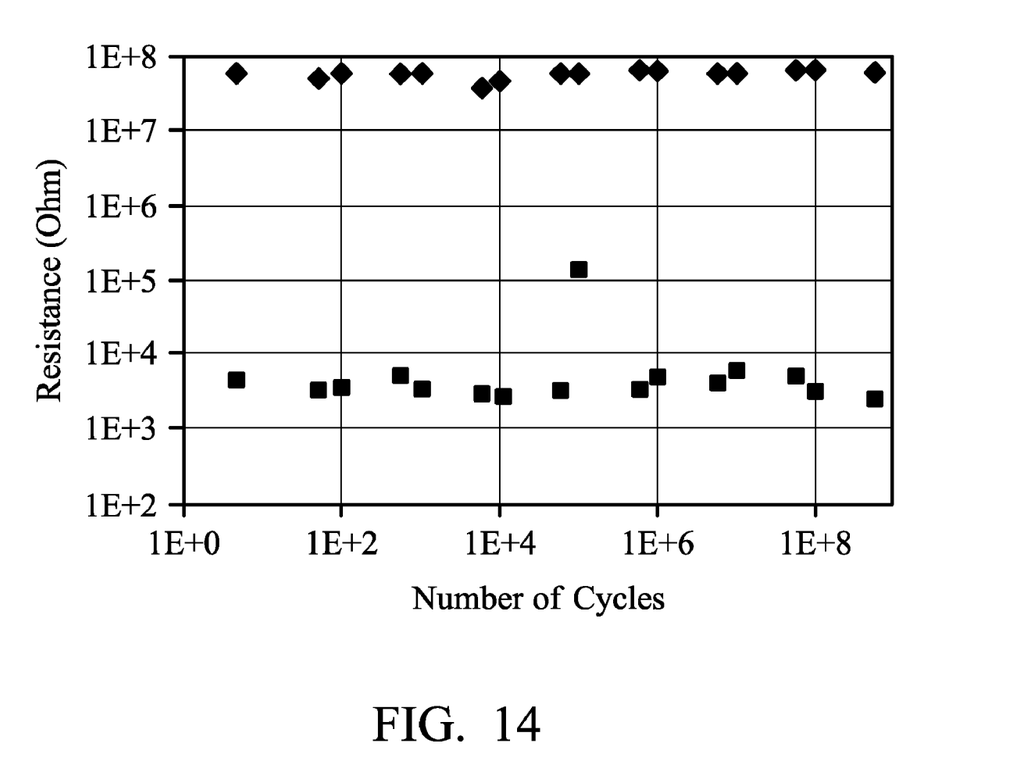
FIG. 14 illustrates reliability test results showing that the resistances of the PCRAM cells are stable under set/reset cycles.

FIG. 14 illustrates the reliability test results, wherein access transistors are tested together with the PCRAM cells. The x-axis indicates the number of set/reset cycles performed to a sample, while the Y-axis indicates the resistance of the sample. Diamonds are the resistances of the sample after reset operations, while squares are the resistances of the sample after the set operations. It is noted that the embodiments of the present invention can be reliably operated more than about $2 \times 10^8$ cycles, while still no degradation is observed.

The embodiments of the present invention have several advantageous features. The formation processes of the PCRAM cells are compatible with the formation of peripheral circuits, with only three or less additional photo masks required. The manufacturing cost is thus reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a dielectric layer comprising an upper portion and a lower portion, wherein the dielectric layer is selected from the group consisting essentially of an inter-layer dielectric (ILD) and an inter-metal dielectric (IMD);
   a phase change random access memory (PCRAM) cell comprising a phase change strip, wherein the phase change strip is on the lower portion of the dielectric layer and comprises a top surface lower than a top surface of the dielectric layer, and a bottom surface higher than a bottom surface of the dielectric layer;
   a first conductive column electrically connected to the phase change strip, wherein the first conductive column extends from the top surface of the dielectric layer down into the dielectric layer; and
   a second conductive column in a peripheral region, wherein the second conductive column extends from the top surface of the dielectric layer down into the dielectric layer, and wherein the first conductive column and the second conductive column have different heights.

2. The integrated circuit structure of claim 1, wherein the dielectric layer is the ILD, and wherein the second conductive column is a source/drain contact plug of a peripheral transistor.

3. The integrated circuit structure of claim 2, wherein the first conductive column is a contact plug extending down to physically contact the phase change strip.

4. The integrated circuit structure of claim 2 further comprising a bottom electrode underlying and contacting the phase change strip, wherein the first conductive column is a contact plug extending down to contact the bottom electrode.

5. The integrated circuit structure of claim 2 further comprising:
   an access transistor comprising a source/drain region; and
   an additional contact plug electrically connected to the source/drain region and contacting the bottom surface of the phase change strip, wherein the first conductive column and the additional contact plug are connected to opposite ends of the phase change strip.

6. The integrated circuit structure of claim 2 further comprising:
   an access transistor comprising a source/drain region;

a bottom electrode underlying and contacting the phase change strip; and an additional contact plug electrically connected to the source/drain region and contacting a bottom surface of the bottom electrode, wherein the first conductive column and the additional contact plug are connected to opposite ends of the phase change strip.

7. The integrated circuit structure of claim 2 further comprising:

an access transistor comprising a source/drain region;

an additional contact plug electrically connected to the source/drain region:

a metal line in a bottom metallization layer and contacting the additional contact plug; and a third conductive column having substantially the same height as the first conductive column connected between the metal line and the phase change strip.

8. The integrated circuit structure of claim 1, wherein the dielectric layer is an IMD between and adjoining a first metallization layer and a second metallization layer over the first metallization layer, and wherein the integrated circuit structure further comprises:

a first metal line in the first metallization layer;

a second metal line in the second metallization layer;

a first via between and contacting the first metal line and the second metal line; and a second via between and contacting the second metal line and the phase change strip.

9. The integrated circuit structure of claim 8 further comprising:

a third metal line in the second metallization layer; and a third via between and contacting the third metal line and the phase change strip.

10. An integrated circuit structure comprising:

an access transistor comprising a first source/drain region;

a bottom metallization layer over the access transistor;

an inter-layer dielectric (ILD) over the access transistor, and under and contacting the bottom metallization layer, wherein the ILD comprises a lower portion and an upper portion;

a first contact plug directly over and connected to the first source/drain region, wherein the first contact plug is in the ILD;

a phase change strip over the lower portion of the ILD and having a top surface lower than a top surface of the ILD;

a second contact plug in the upper portion of the ILD and electrically connected to the phase change strip, wherein the second contact plug does not extend into the lower portion of the ILD;

a peripheral transistor comprising a second source/drain region; and a third contact plug extending from a top surface of the ILD into the ILD and electrically connected to the second source/drain region, wherein the third contact plug has a continuous sidewall profile, and wherein a first bottom surface of the second contact plug is higher than a second bottom surface of the third contact plug.

11. The integrated circuit structure of claim 10, wherein the first bottom surface of the second contact plug contacts the top surface of the phase change strip.

12. The integrated circuit structure of claim 11 further comprising a fourth contact plug directly underlying and connecting the third contact plug to the second source/drain region.

13. The integrated circuit structure of claim 10 further comprising a bottom electrode underlying and contacting both the first bottom surface of the second contact plug and a bottom surface of the phase change strip.

14. The integrated circuit structure of claim 10 further comprising a bottom electrode contacting a top surface of the first contact plug and a bottom surface of the phase change strip.

15. The integrated circuit structure of claim 10 further comprising:

a bottom electrode underlying and contacting a bottom surface of the phase change strip:

a metal line in the bottom metallization layer, wherein the first contact plug contacts a bottom of the metal line; and a fourth contact plug connecting the bottom surface of the metal line to the top surface of the phase change strip.

16. An integrated circuit structure comprising:

a semiconductor substrate;

a first metallization layer over the semiconductor substrate;

a second metallization layer over the first metallization layer;

an inter-metal dielectric (IMD) between the first metallization layer and the second metallization layer;

a phase change random access memory (PCRAM) cell comprising a phase change strip, wherein the phase change strip comprises a top surface lower than a top surface of the IMD, and a bottom surface higher than a bottom surface of the IMD;

a first metal line in the first metallization layer;

a second metal line in the second metallization layer;

a first via between and contacting the first metal line and the second metal line; and a second via between and contacting the second metal line and the phase change strip.

17. The integrated circuit structure of claim 16 further comprising:

a third metal line in the second metallization layer; and a third via between and contacting the third metal line and the phase change strip.

18. The integrated circuit structure of claim 16, wherein the first via and the second via comprise copper.

19. The integrated circuit structure of claim 16 further comprising:

an inter-layer dielectric underlying the first metallization layer; and an additional PCRAM cell comprising an additional phase change strip, wherein the additional phase change strip comprises a top surface lower than a top surface of the ILD, and a bottom surface higher than a bottom surface of the ILD.

* * * * *